United States Patent [19]
Krames et al.

[11] Patent Number: 6,133,589
[45] Date of Patent: Oct. 17, 2000

[54] ALGAINN-BASED LED HAVING THICK EPITAXIAL LAYER FOR IMPROVED LIGHT EXTRACTION

[75] Inventors: Michael Ragan Krames, Mountain View; Paul Scott Martin, Pleasanton; Tun Sein Tan, Cupertino, all of Calif.

[73] Assignee: LumiLeds Lighting, U.S., LLC, San Jose, Calif.

[21] Appl. No.: 09/328,870

[22] Filed: Jun. 8, 1999

[51] Int. Cl.$^7$ .................................................. H01L 33/00
[52] U.S. Cl. ............................................................. 257/103
[58] Field of Search ............................................. 257/103

[56] References Cited

U.S. PATENT DOCUMENTS

| | | | |
|---|---|---|---|
| 5,008,718 | 4/1991 | Fletcher et al. | 357/17 |
| 5,233,204 | 8/1993 | Fletcher et al. | 257/13 |
| 5,693,963 | 12/1997 | Fujimoto et al. | |
| 5,710,440 | 1/1998 | Okagawa et al. | |
| 5,811,839 | 9/1998 | Shimoyama et al. | 257/94 |
| 5,932,896 | 8/1999 | Sugiura et al. | |

*Primary Examiner*—Stephen D. Meier
*Attorney, Agent, or Firm*—Skjerven Morrill MacPherson LLP; Brian D. Ogonowsky; Rachael V. Leiterman

[57] ABSTRACT

A light-emitting diode (LED) and a method of making the device utilize a thick multi-layered epitaxial structure that increases the light extraction efficiency of the device. The LED is an aluminum-gallium-indium-nitride (AlGaInN)-based LED. The thick multi-layered epitaxial structure increases the light extraction efficiency of the device by increasing the amount of emitted light that escapes the device through the sides of the thick multi-layered epitaxial structure. The LED includes a substrate, a buffer layer, and the thick multi-layered epitaxial structure. In the preferred embodiment, the substrate is a sapphire substrate having a textured surface. The textured surface of the substrate randomized light impinges the textured surface, so that an increased amount of emitted light may escape the LED as output light. The multi-layered epitaxial structure includes an upper AlGaInN region, an active region, and a lower AlGaInN region. The upper and lower AlGaInN regions include multiple epitaxial layers of AlGaInN. The upper AlGaInN region is made of p-type AlGaInN epitaxial layers, while the lower AlGaInN region is made of n-type AlGaInN epitaxial layers and undoped epitaxial layers. The undoped epitaxial layers may be layers of AlGaInN or other AlGaInN-based material. The multi-layered epitaxial structure has an approximate thickness of 4 micrometers or greater. In one embodiment, the thickness of the multi-layered epitaxial structure is approximately 7 micrometers. In another embodiment, the thickness of the multi-layered epitaxial structure is approximately 15 micrometers.

14 Claims, 8 Drawing Sheets

ALGAINN-BASED LED HAVING THICK EPITAXIAL LAYER FOR IMPROVED LIGHT EXTRACTION

TECHNICAL FIELD

The invention relates generally to light-emitting diodes and more particularly to AlGaInN-based light-emitting diodes.

BACKGROUND ART

Light emitting diodes (LEDs) are well known solid state devices that can generate light having a peak wavelength in a specific region of the light spectrum. LEDs are typically used as illuminators, indicators and displays. Aluminum-gallium-indium-nitride (AlGaInN)-based LEDs can emit light having a peak wavelength in the blue and green region of the visible light spectrum with greater luminous intensity than other conventional LEDs. Due to their superior luminance, the AlGaInN-based LEDs have attracted much attention in recent years.

An exemplary prior art AlGaInN-based LED is schematically illustrated in FIG. 1. The AlGaInN-based LED 10 includes a sapphire ($Al_2O_3$) substrate 12 and a multi-layered epitaxial structure 14. The multi-layered epitaxial structure includes an upper AlGaInN region 16, an active region 18, and a lower AlGaInN region 20. The term "AlGaInN" is defined herein as a material composed of one or more elements from a set that includes aluminum, gallium, indium, and nitrogen. The upper AlGaInN region and the lower AlGaInN region are made of multiple epitaxial layers of AlGaInN. The upper AlGaInN region is made of p-type AlGaInN epitaxial layers, while the lower AlGaInN region is made of n-type and/or undoped AlGaInN epitaxial layers. The active region includes one or more layers of indium-gallium-nitride (InGaN) that form(s) what is/are commonly referred to as quantum well(s). The typical thickness of the upper AlGaInN region is less than 0.5 micrometers, while the typical thickness of the lower AlGaInN region is approximately 2 to 3 micrometers. The active region thickness is typically less than 0.2 micrometers. Therefore, the typical maximum thickness of the multi-layered epitaxial structure is approximately 3.7 micrometers.

An ohmic p-contact 22 is connected to the upper AlGaInN region 16, while an ohmic n-contact 24 is connected to the top surface of the lower AlGaInN region 20. The ohmic contacts provide electrical conduction through the active region 18 of the multi-layered epitaxial structure 14. Located on the top surface of the upper AlGaInN region and electrically connected to the ohmic p-contact is a semi-transparent metallic layer 26. The semi-transparent metallic layer may be made of oxidized nickel and gold. The semi-transparent metallic layer functions as a current spreader to distribute current throughout the area of the active region. Situated between the sapphire substrate 12 and the conductive structure is a buffer layer 28. The buffer layer serves as a transition layer to ensure proper growth of the lower AlGaInN region on the sapphire substrate. The buffer layer is made of AlGaInN-based material.

During a light-emitting operation, voltage is applied to the ohmic contacts 22 and 24 to forward bias the LED 10. The forward biased condition of the LED causes holes to be injected into the active region 18 from the upper AlGaInN region 16. Furthermore, the forward biased condition causes electrons to be injected into the active region from the lower AlGaInN region 20. Within the quantum well(s) of the active region, the injected holes and electrons recombine, which results in emission of light. The generated light is emitted in all directions, as illustrated by the arrows in the active region. Some of the emitted light escapes the LED from the top of the LED through the semi-transparent metallic layer as output light. Also, some of the light emits into the substrate 12 and escapes out the sides of the device. However, much of the emitted light must escape from within the multi-layered epitaxial structure 14 out the sides of the LED, after reflecting from the upper surface of the sapphire substrate and the lower surfaces of an encapsulation epoxy layer (not shown) that covers the LED. This is illustrated by an exemplary path 30 of such emitted light. The overall light output of the LED includes the portion of the emitted light that escapes through the sides of the multi-layered epitaxial structure, as well as the portion that escapes through the top surface and through the substrate.

Light extraction from AlGaInN-based LEDs, such as the LED 10, is limited by the various parasitic optical loss mechanisms present within or surrounding the AlGaInN epitaxial layers. These mechanisms include absorption at the semi-transparent metallic layer 26, as well as absorption within many layers comprising the epitaxial portion of the LED, such as the buffer layer 28, the active region 18 and the heavily Mg-doped GaN contact layer 16. Because of the refractive index step between the multi-layered epitaxial structure (n=2.4) and the sapphire substrate (n=1.77) or the encapsulation epoxy layer (n=1.5), only approximately 25% of the light generated within the active region escapes into the epoxy or the substrate upon first encountering these interfaces. The rest of the light is trapped in a waveguide formed by the encapsulation epoxy layer above the chip and the substrate. The trapped light must travel distances on the order of the length of the chip to escape from the sides of the LED. Such distances require many passes through the various loss mechanisms within the LED structure, increasing the probability of absorption. Thus, much of this trapped light is eventually lost, decreasing the overall light output of the LED.

Therefore, what is needed is an AlGaInN-based LED structure that reduces the amount of emitted light that is lost to the various loss mechanisms, thereby increasing the overall output of the device.

SUMMARY OF THE INVENTION

A light-emitting diode (LED) and a method of making the device utilize a thick multi-layered epitaxial structure that increases the light extraction efficiency of the device. The LED is an aluminum-gallium-indium-nitride (AlGaInN)-based LED. The thick multi-layered epitaxial structure increases the light extraction efficiency of the device by increasing the amount of emitted light that escapes the device through the sides of the thick multi-layered epitaxial structure.

The LED includes a substrate, a buffer layer, and the thick multi-layered epitaxial structure. The substrate is preferably made of sapphire. Since the improvements with increased epitaxial thickness on light extraction will be manifested as long as the substrate or an overgrowth layer on the substrate, if any, has an refractive index of appreciably less than that of the multi-layered AlGaInN epitaxial structure (n~2.4 effectively), other substrates are possible. For the purposes of this teaching, significant improvements in light extraction are expected for different substrates, provided that the refractive index of the substrate or the overgrowth layer is less than 2.1. Also, the substrate may support layers of zinc-oxide, silicon-dioxide, or another dielectric material to provide particular characteristics during growth. In the preferred embodiment, the upper surface of the substrate is textured to randomize the light that impinges upon the textured surface. As an example, the surface may be mechanically textured by polishing the surface with a relatively coarse grinding grit. The buffer layer is formed over the substrate by epitaxially growing a layer of AlGaInN-based material. The buffer layer serves as a transition layer to ensure proper growth of the multi-layered epitaxial structure upon the substrate.

The multi-layered epitaxial structure includes an upper AlGaInN region, an active region, and a lower AlGaInN region. The upper and lower AlGaInN regions include multiple epitaxial layers of AlGaInN. The upper AlGaInN region is made of p-type AlGaInN epitaxial layers, while the lower AlGaInN region is made of n-type AlGaInN epitaxial layers and undoped epitaxial layers. The undoped epitaxial layers may be layers of AlGaInN or other AlGaInN-based material. The active region includes at least one AlGaInN light-emitting layer that forms the quantum well(s). For visible spectrum LEDs, the light-emitting layer is typically comprised of InGaN. The multi-layered epitaxial structure is thicker than conventional multi-layered epitaxial structures. The multi-layered epitaxial structure has an approximate thickness of 4 micrometers or greater. In one embodiment, the thickness of the multi-layered epitaxial structure is approximately 7 micrometers. In another embodiment, the thickness of the multi-layered epitaxial structure is approximately 15 micrometers. However, the thickness of the multi-layered epitaxial structure may be greater than 15 micrometers.

The increased thickness of the multi-layered epitaxial structure allows trapped light within a waveguide, formed by the upper surface of the substrate and the lower surface of an encapsulating epoxy layer that covers the LED, to escape the LED through the sides of the multi-layered epitaxial structure with fewer reflections. In particular, the increased thickness of the multi-layered epitaxial structure allows a greater amount of emitted light to exit from the sides of the multi-layered epitaxial structure with a single reflection from either the upper surface of the substrate or the lower surface of the encapsulation epoxy layer. The decrease in the number of reflections for the trapped light reduces the amount of light that is absorbed by various parasitic optical loss mechanisms present within or surrounding the AlGaInN epitaxial layers. The effect of this reduction is an overall increase in the light output of the LED.

DETAILED DESCRIPTION

Figure 1:
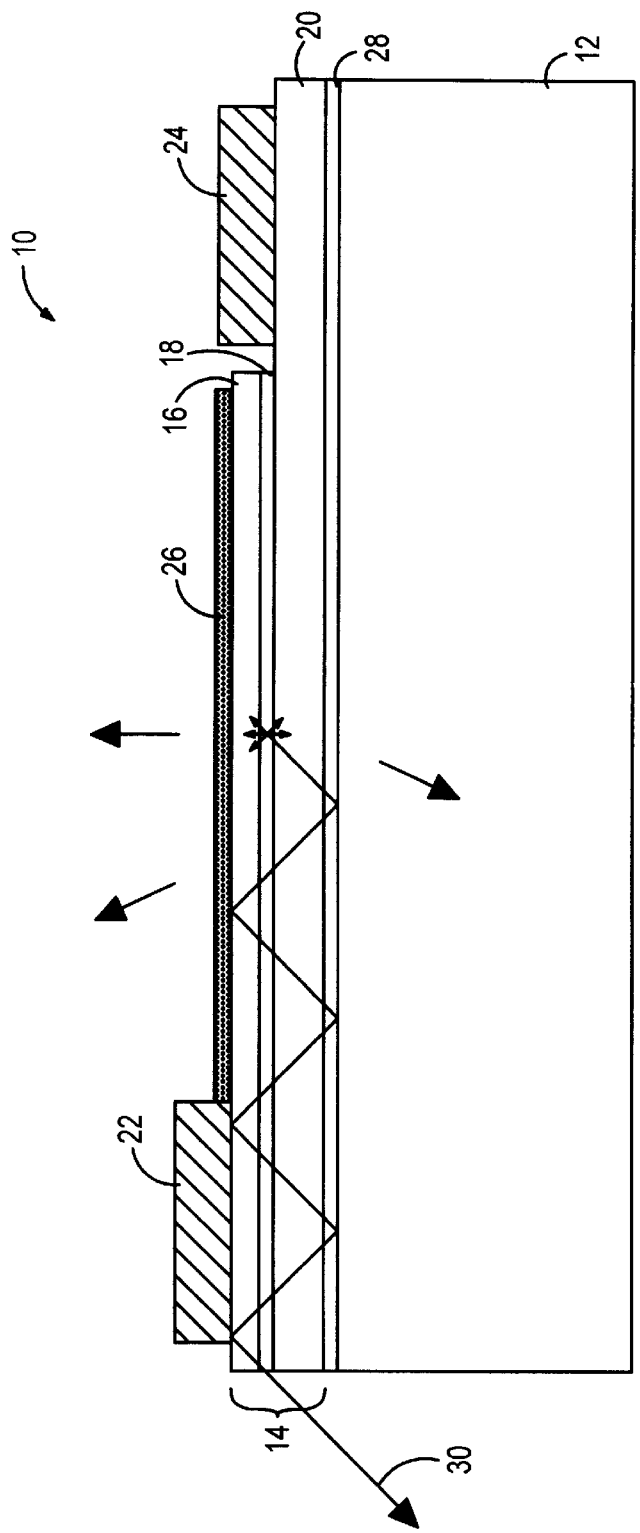
FIG. 1 is a schematic diagram of a prior art AlGaInN-based LED.
Figure 2:
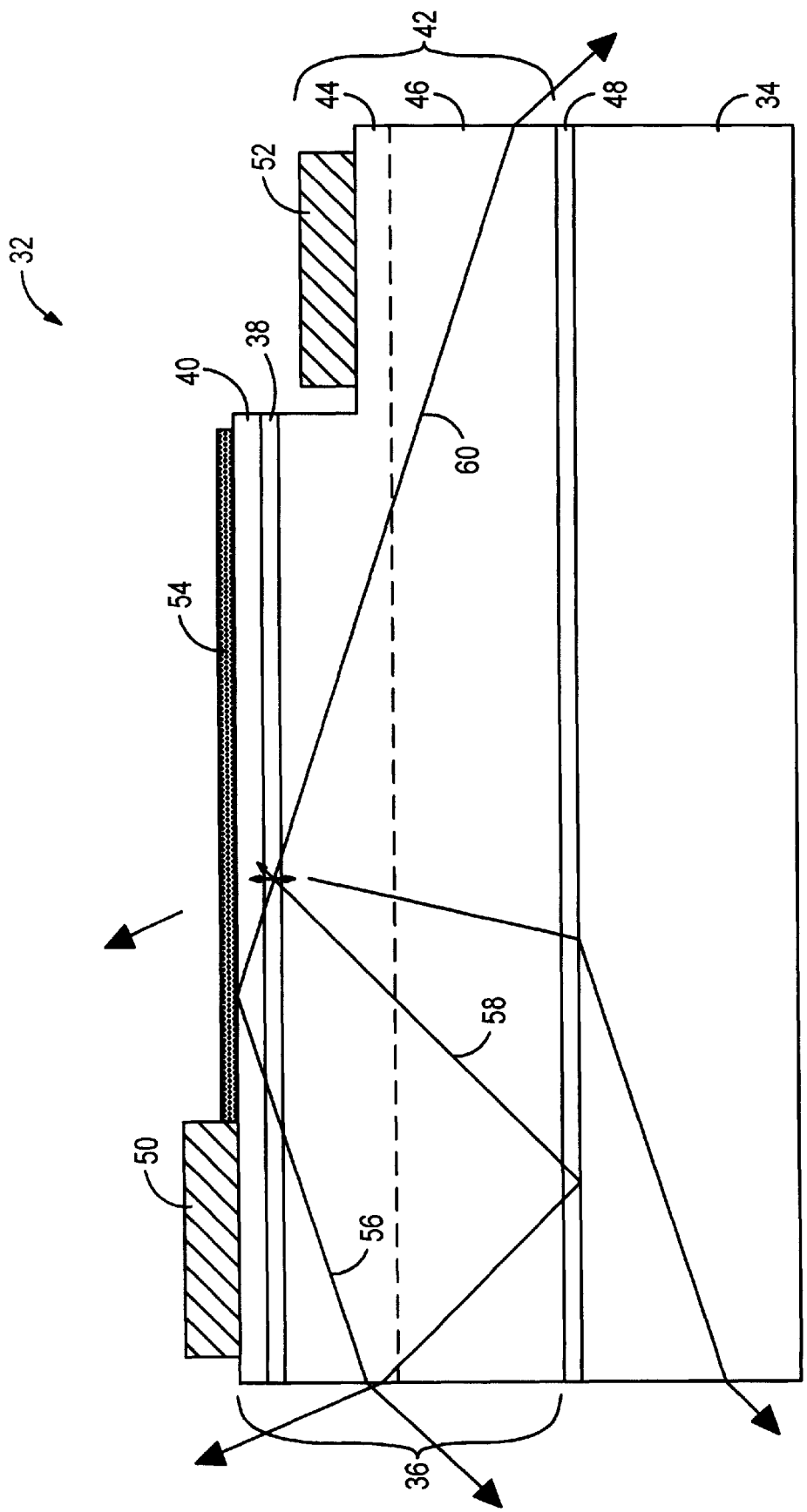
FIG. 2 is a schematic diagram of an AlGaInN-based LED having a thick multi-layered epitaxial structure in accordance with the present invention.

With reference to FIG. 2, an aluminum-gallium-indium-nitride (AlGaInN)-based light-emitting diode (LED) 32 in accordance with the present invention is shown. The AlGaInN-based LED includes a substrate 34 and a multi-layered epitaxial structure 36. As compared to multi-layered epitaxial structures of conventional AlGaInN-based LEDs, such as the multi-layered epitaxial structure 14 of LED 10 of FIG. 1, the multi-layered epitaxial structure 36 of the AlGaInN-based LED 32 is substantially thicker. The increased thickness of the multi-layered epitaxial structure increases the portion of the light generated by an active region 38 that escapes from the LED 32 through the sides of the multi-layered epitaxial structure. The manner in which the thick multi-layered epitaxial structure facilitates the increased emission of light from the LED will be described in detail below.

The multi-layered epitaxial structure 36 includes an upper AlGaInN region 40, the active region 38, and a lower AlGaInN region 42. The upper and lower AlGaInN regions include multiple epitaxial layers of AlGaInN. The upper AlGaInN region is made of p-type AlGaInN epitaxial layers, while the lower AlGaInN region is made of n-type AlGaInN epitaxial layers and undoped epitaxial layers. The portion of the lower AlGaInN region having the n-type AlGaInN epitaxial layers is identified by the reference numeral 44. The portion of the lower AlGaInN region having the undoped epitaxial layers is identified by the reference numeral 46. The undoped epitaxial layers may be layers of AlGaInN or other AlGaInN-based material. The active region includes at least one AlGaInN light-emitting layer that forms the quantum well(s). For visible light emission, the light-emitting layer may be comprised of indium-gallium-nitride (InGaN). The multi-layered epitaxial structure has an approximate thickness of 4 micrometers or greater. In one embodiment, the thickness of the multi-layered epitaxial structure is approximately 7 micrometers. In another embodiment, the thickness of the multi-layered epitaxial structure is approximately 15 micrometers. However, the thickness of the multi-layered epitaxial structure may be greater than 15 micrometers.

Figure 3:
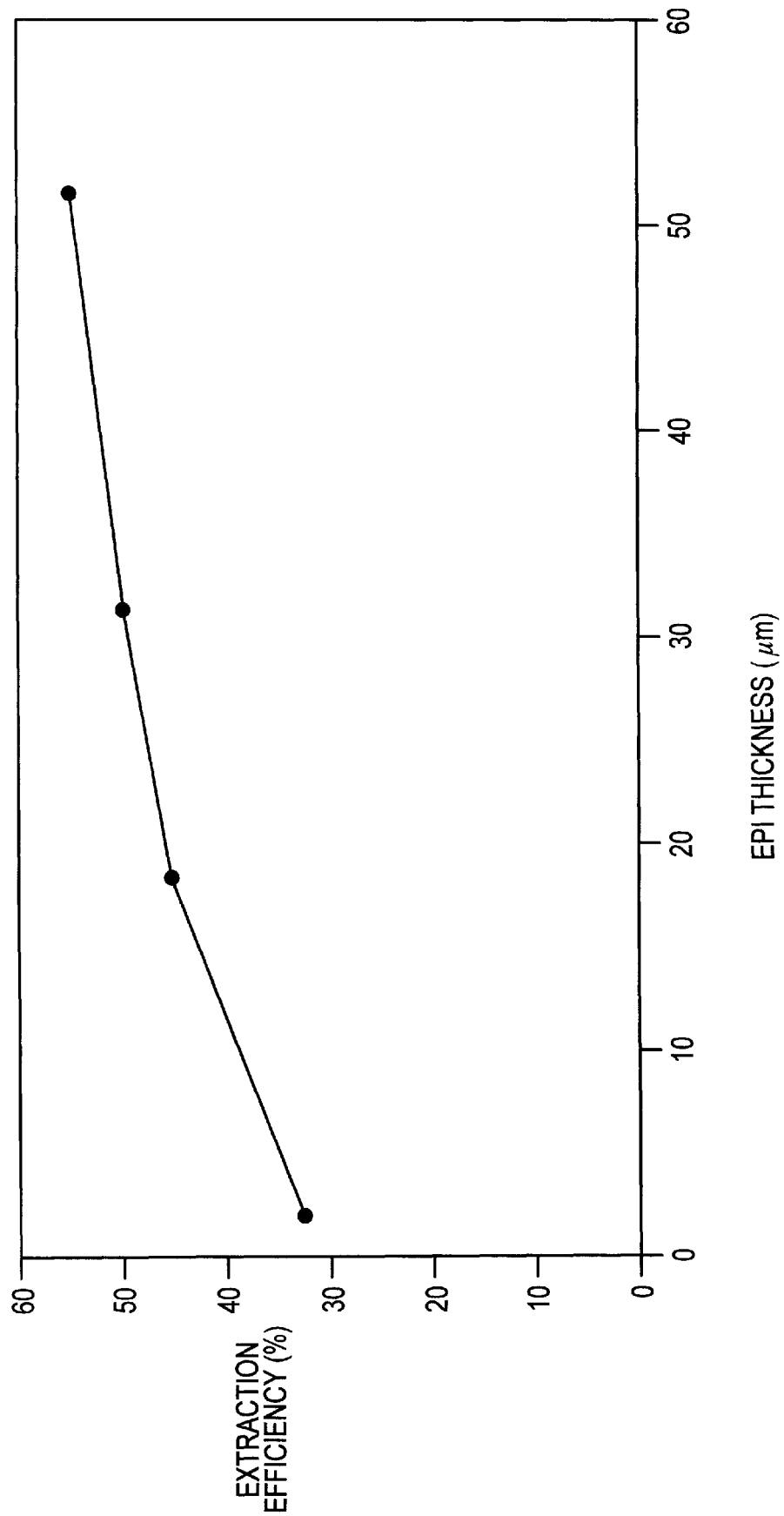
FIG. 3 shows a plot of extraction efficiency vs. epitaxial thickness from numerical ray-trace modeling calculations.

A plot of extraction efficiency vs. epitaxial thickness from numerical ray-trace modeling calculations is shown in FIG. 3. Because of issues such as cracking due to strain, it is not obvious that high-quality active regions can be grown atop thick AlGaInN structures. For certain choices of buffer layer and lower AlGaInN layer composition and doping (heavy or light, n-type or p-type, or undoped), high quality active regions are achieved and in fact increased quantum efficiency is observed. Strain can also be controlled by the use of AlGaN layers or AlGaInN-based superlattice structures to balance tensile and compressive forces within the epitaxial structure and minimize defect formation which can reduce the internal quantum efficiency of the active region.

The increased thickness of the multi-layered epitaxial structure 36 may be achieved by increasing only the thickness of the lower AlGaInN region 42, as shown in FIG. 2. However, other geometries are possible. For example, the increased thickness of the multi-layered epitaxial structure may be achieved by increasing only the thickness of the upper AlGaInN region 40. Alternatively, the increased thickness of the multi-layered epitaxial structure may be achieved by increasing the thicknesses of both the upper 40 and lower 42 AlGaInN regions.

Situated between the multi-layered epitaxial structure 36 and the substrate 34 is a buffer layer 48. The buffer layer serves as a transition layer to ensure proper adhesion between the lower AlGaInN region 42 and the substrate. The buffer layer is made of AlGaInN-based material. The substrate is preferably made of sapphire ($Al_2O_3$). Since the improvements with increased epitaxial thickness on light extraction will be manifested as long as the substrate or an overgrowth layer on the substrate, if any, has a refractive index of appreciably less than that of the multi-layered AlGaInN epitaxial structure (n~2.4 effectively), other substrates are possible. For the purposes of this teaching, significant improvements in light extraction are expected for different substrates, provided that the refractive index of the substrate or the overgrowth layer is less than 2.1. Also, the substrate may support layers of zinc-oxide (ZnO), silicon-dioxide ($SiO_2$), or another dielectric material to provide particular characteristics during growth. In the preferred embodiment, the upper surface of the substrate is textured to randomize the incident light emitted from the active region 38. The textured substrate increases the probability of incident light escaping the LED through the sides of the multi-layered epitaxial structure. The textured sapphire substrate allows for growth of thick AlGaInN epitaxial layers (>7 $\mu$m) with a significantly reduced susceptibility to cracking, relative to growth on non-textured substrates.

The LED 32 includes an ohmic p-contact 50 and an ohmic n-contact 52 that supply electrical power is to the LED. The ohmic p-contact is electrically coupled to the upper AlGaInN region 40 of the multi-layered epitaxial structure 36, while the ohmic n-contact is electrically coupled to the n-type AlGaInN epitaxial layers 44 of the lower AlGaInN region 46. The lower AlGaInN region 46 may be undoped or p-type and is optional in the structure. Deposited over the upper AlGaInN region and electrically connected to the ohmic p-contact is a semi-transparent metallic layer 54. The semi-transparent metallic layer functions as a current spreader to distribute current throughout the area of the active region 38. The semi-transparent metallic layer can be made of nickel-oxide (NiO) and gold (Au). In one embodiment, the semi-transparent metallic layer is formed by first depositing a layer of Ni that is oxidized before or during deposition to form a layer of NiO. A layer of Au is then deposited over the layer of NiO, and the two layers are annealed. This process allows the semi-transparent metallic layer to be formed using a thinner layer of Au than traditional semi-transparent metallic layers. In this preferred embodiment, the Au layer used to form the semi-transparent metallic layer 54 has a thickness of approximately 50 Angstroms. In comparison, the Au layer used to form a traditional semi-transparent metallic layer has a thickness of approximately 113 Angstroms. As an alternative to depositing the Au after the NiO, the two materials can be co-deposited using reactive sputtering or reactive evaporation techniques.

The light-emitting operation of the AlGaInN-based LED 32 is identical to conventional AlGaInN-based LEDs, such as the AlGaInN-based LED 10 of FIG. 1. In order to activate the LED 32, voltage is applied to the ohmic contacts 50 and 52 to forward bias the LED. The forward biased condition of the LED causes holes to be injected into the active region 38 from the upper AlGaInN region 40. Furthermore, the forward biased condition causes electrons to be injected into the active region from the n-type AlGaInN epitaxial layers 44 of the lower AlGaInN region 42. Within the quantum well(s) of the active region, the injected holes and electrons recombine, which results in emission of light. The generated light is emitted in all directions, as illustrated by the arrows in the active region. Some of the emitted light escapes the LED through the semi-transparent metallic layer 54 as output light, while some of the emitted light escapes out the sides of the LED through the substrate 34. Another portion of the emitted light escapes the LED from the sides of the multi-layered epitaxial structure 36, after reflecting from the upper surface of the substrate 34 and the lower surfaces of an encapsulation epoxy layer (not shown) that covers the LED, as illustrated by exemplary paths 56, 58 and 60 of such emitted light rays. The overall light output of the LED includes the portion of the emitted light that escapes through the sides of the LED, as well as the portion that escapes through the top and through the substrate.

Similar to conventional AlGaInN-based LEDs, the refractive index step between the multi-layered epitaxial structure 36 (n=2.4) and the substrate 34 (n=1.77 for sapphire) or the encapsulation epoxy layer (1.5) allows only about 25% of the light generated within the active region 38 to escape into the epoxy or the substrate upon first encountering these interfaces. The rest of the light is trapped in a waveguide formed by the encapsulation epoxy layer above the chip and the substrate. The trapped light encounters various loss mechanisms that reduce the amount of light that can escape the LED through the sides of the multi-layered epitaxial structure. These loss mechanisms include absorption at the semi-transparent metallic layer 54, as well as absorption within the many layers comprising the epitaxial portion of the LED 32, such as the buffer layer 48, the active region 38, and the heavily Mg-doped GaN contact layer. With each pass through the loss mechanisms, the probability of absorption is increased.

The increased thickness of the multi-layered epitaxial structure 36 allows the trapped light within the formed waveguide to escape the LED 32 through the sides of the multi-layered epitaxial structure with fewer passes through the loss mechanisms. In particular, the increased thickness of the multi-layered epitaxial structure allows a greater amount of emitted light to exit from the sides of the multi-layered epitaxial structure with at most a single reflection from either the upper surface of the substrate 34 or the lower surface of the encapsulation epoxy layer, as illustrated by the light rays 56, 58 and 60 in FIG. 2. Such light rays will be referred herein as "first-pass" extracted light. The increased amount of first-pass extracted light consequently results in an increase light output of the LED.

Figure 4:
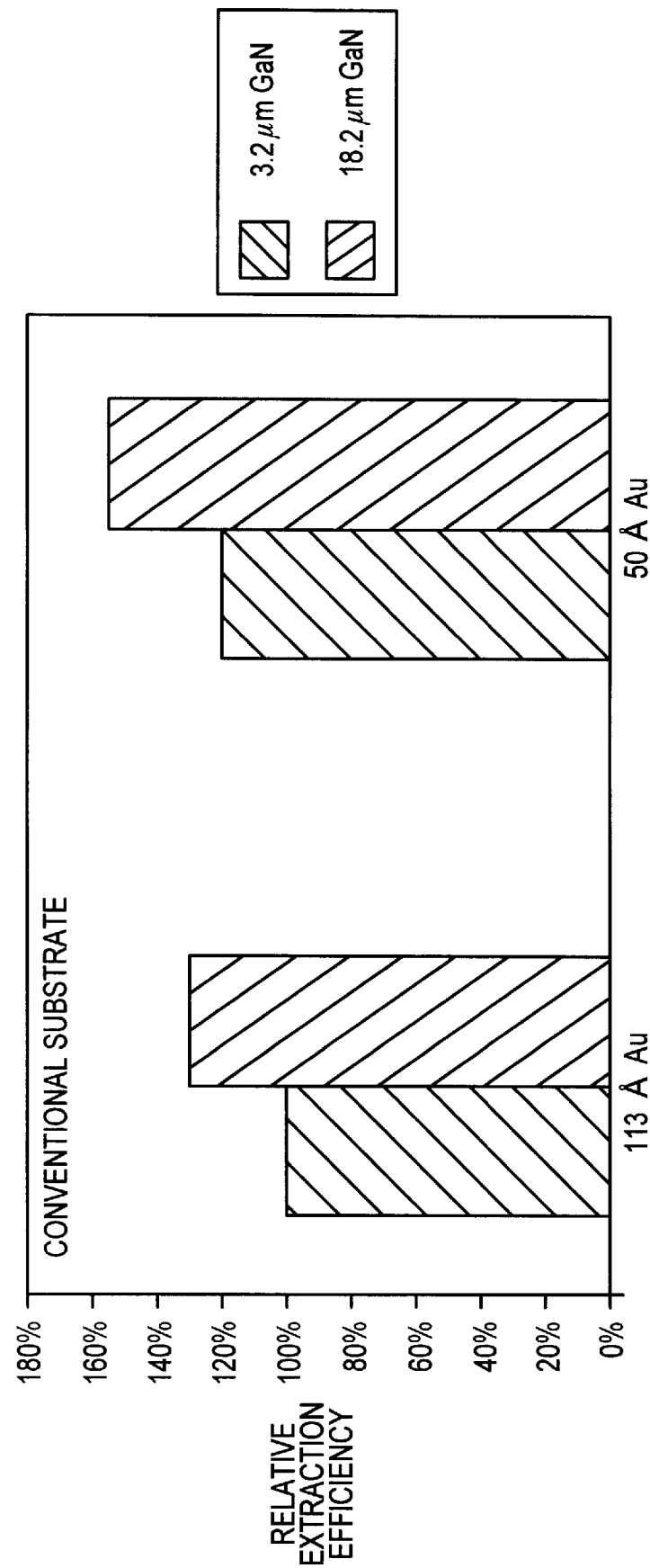
FIG. 4 shows the relative extraction efficiency of 300×400 $\mu m^2$ AlGaInN-based LEDs with multi-layered epitaxial structures with thicknesses of 3.2 and 18.2 $\mu m$, respectively, for different thicknesses of Au semi-transparent top metalization. In these cases all AlGaInN interfaces are non-textured.

Ray-trace modeling of light extraction from the AlGaInN-based LEDs confirms the improved first-pass light extraction via increased thickness of the multi-layered epitaxial structure. FIG. 4 shows the relative extraction efficiency of 300×400 $\mu m^2$ AlGaInN-based LEDs with multi-layered epitaxial structures with thicknesses of 3.2 $\mu$m and 18.2 $\mu$m, respectively. For one case, a typical semi-transparent metallic layer was formed using a layer of Au having a thickness of 113 Angstroms. Such a semi-transparent metallic layer 26 is shown in FIG. 1. In the second case, the semi-transparent metallic layer was formed using a layer of Au with a reduced thickness of 50 Angstroms, such as the semi-transparent metallic layer 54 of FIG. 2. The data are normalized to the case of a thick Au and thin AlGaInN, i.e., an AlGaInN-based LED that includes the typical semi-transparent layer that was formed using a 113 Angstroms thick Au layer and a conventional multi-layered epitaxial structure having a thickness of 3.2 µm. Note that, in both cases, the increased multi-layered epitaxial structure thickness significantly improves extraction efficiency over the case of a typical multi-layered epitaxial structure. The improvement in extraction efficiency due to the increased multi-layered epitaxial structure is about +25–30% in these cases.

Figure 5:
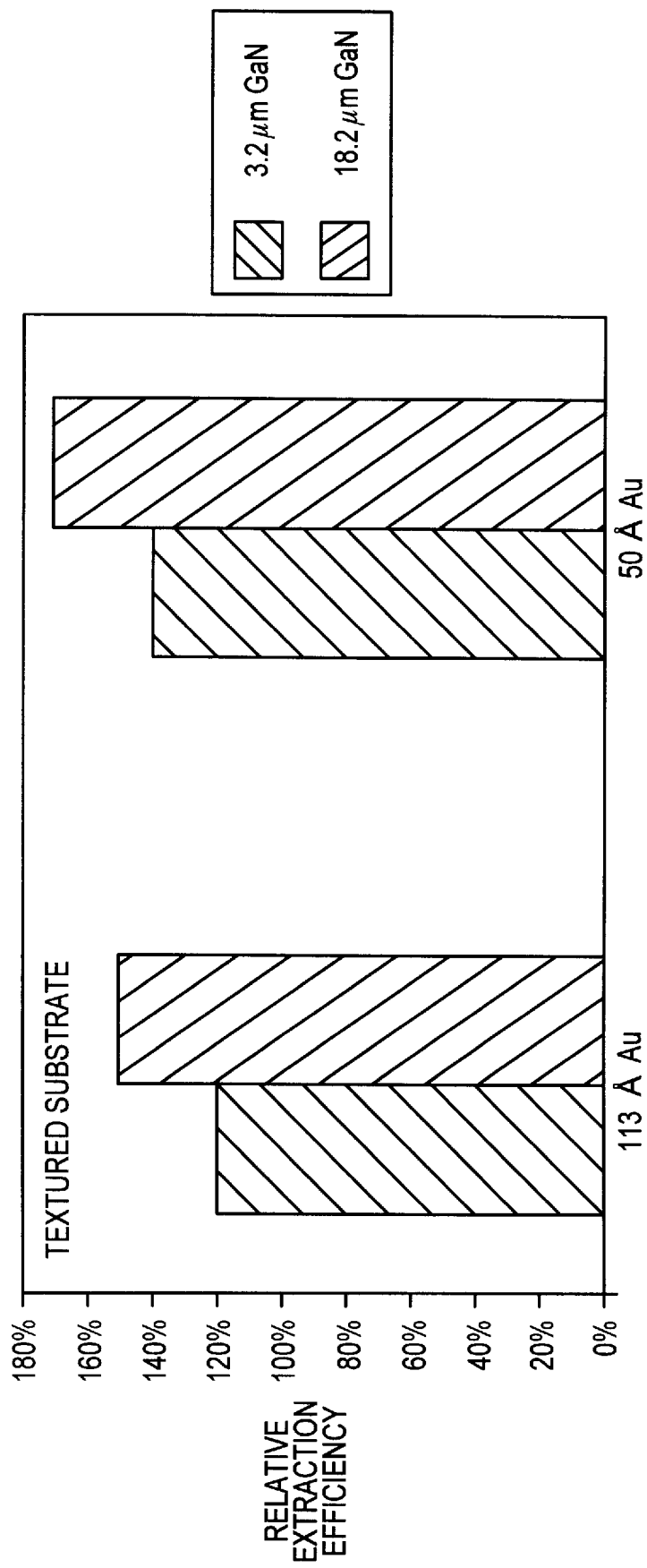
FIG. 5 shows the modeled relative light extraction efficiency of the 300×400 $\mu m^2$ AlGaInN-based LEDs employing a textured AlGaInN/substrate interface.

Even for the case of a device with a rough or textured AlGaInN/sapphire interface, the increased multi-layered epitaxial structure thickness leads to an improvement in light extraction efficiency. FIG. 5 shows the modeled relative light extraction efficiency for devices similar to those used for FIG. 4, with the inclusion of a textured AlGaInN/sapphire interface. The textured AlGaInN/sapphire interface randomizes incident light on the AlGaInN/sapphire interface with a standard deviation of +/−11° with respect to the zero$^{th}$-order reflection. The improvement of light extraction due to the increased thickness of the multi-layered epitaxial structure is 22–27% in these cases. Note the overall increase in extraction efficiency provided by the textured AlGaInN/sapphire interface (FIG. 5 compared to FIG. 4).

Figure 6:
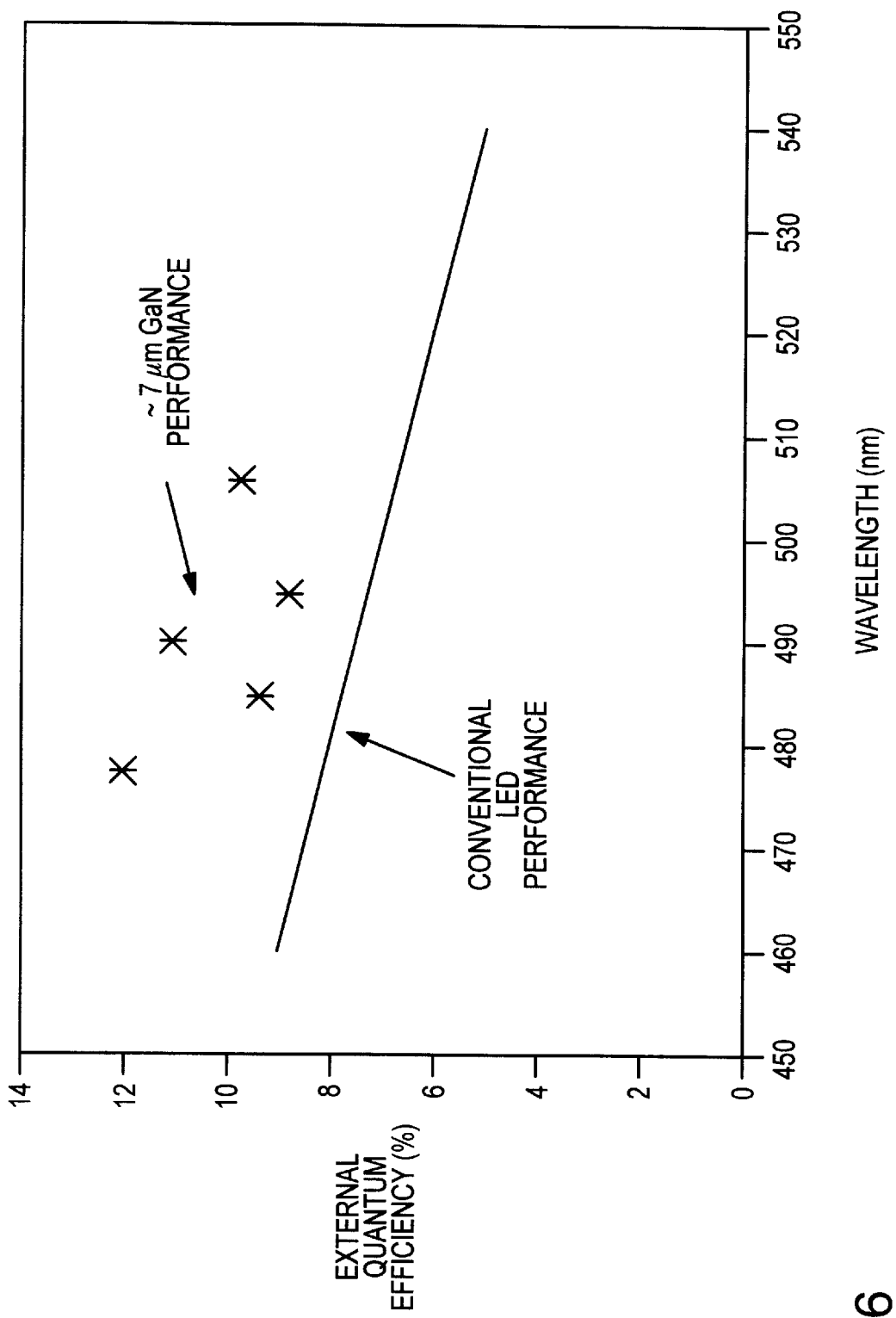
FIG. 6 shows measured light output data for an AlGaInN-based LED having a lower AlGaInN region of the multi-layered epitaxial structure with a thickness of 7 $\mu m$.

Further improvements in the AlGaInN-based LED 32 performance by the use of the thicker multi-layered epitaxial structure 36 may include reduced strain and defect density in the active region 38, improved internal quantum efficiency, and possibly improved wafer characteristics uniformity. Research data indicate that a thicker lower AlGaInN region, e.g., 7 µm, provides devices with increases in efficiency beyond what can be attributable to only the extraction efficiency considerations. This suggests that internal quantum efficiency is improved in LED structures with increased thickness of the lower AlGaInN region, i.e., greater than 3 µm. FIG. 6 shows measured light output data for an AlGaInN-based LED having an increased lower AlGaInN region thickness of 7 µm. The line indicates performance for conventional AlGaInN-based LEDs employing thin epitaxial structures (less than 4 µm). The measured increase in relative external quantum efficiency is 15–40%. Such an increase is more than what can be accounted for by light extraction improvements alone.

Figure 7:
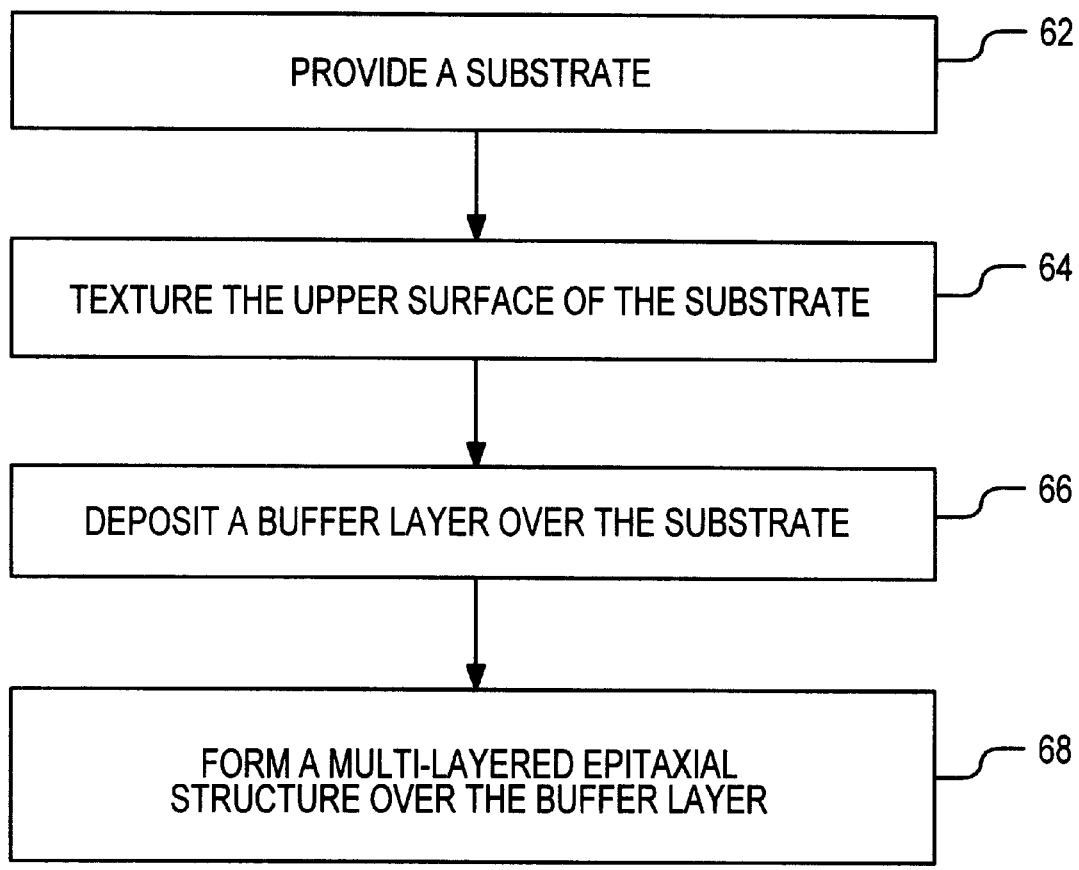
FIG. 7 is a flow diagram of a method of fabricating the AlGaInN-based LED of FIG. 2 in accordance with the invention.

A method of fabricating an AlGaInN-based LED in accordance with the present invention will be described with references to FIG. 7. At step 62, a substrate is provided. The substrate is preferably made of sapphire. Since the improvements with increased epitaxial thickness on light extraction will be manifested as long as the substrate or an overgrowth layer on the substrate, if any, has an refractive index of appreciably less than that of the multi-layered AlGaInN epitaxial structure (n~2.4 effectively), other substrates are possible. For the purposes of this teaching, significant improvements in light extraction are expected for different substrates, provided that the refractive index of the substrate or the overgrowth layer is less than 2.1. Also, the substrate may support layers of zinc-oxide (ZnO), silicon-dioxide (SiO$_2$), or another dielectric material to provide particular characteristics during growth. Next, at step 64, the upper surface of the substrate may be textured. The texturing can be accomplished by any number of techniques. For example, the surface may be mechanically textured by polishing the surface with a relatively coarse grinding grit. In such a process, the sapphire wafer can be mounted on a metal puck affixed over a grinding wheel. Polishing grit is then used to roughen the sapphire to the desired texture. Polishing grit sizes less than 1 micron may be used. The resulting substrate randomizes light that impinges upon the upper surface of the substrate. The substrate may instead be patterned by wet or dry etching techniques. An alternative step is to texture an AlGaInN layer already provided from a previous growth step. This layer can be textured by several means known in the art, and serves as the growth surface for the LED structure in a subsequent growth. At step 66, a buffer layer is deposited over the substrate. The buffer layer is made of AlGaInN-based material.

A multi-layered epitaxial structure is then formed over the buffer layer, at step 68. In one embodiment, the epitaxial layers of the multi-layered epitaxial structure may be grown using an organometallic vapor-phase epitaxy (OMVPE) growth technique. In another embodiment, the epitaxial layers may be grown using a hydride vapor-phase epitaxy (HVPE) growth technique. The HVPE growth technique has the advantage of higher throughput (increased growth rate) over OMVPE, and facilitates the use of thick epitaxial layers in the growth structure. The multi-layered epitaxial structure has an approximate thickness of 4 micrometers or greater. As an example, the thickness of the multi-layered epitaxial structure may be approximately 7 micrometers. However, the thickness of the multi-layered epitaxial structure may be approximately 15 micrometers or greater.

The formation of the multi-layered epitaxial structure includes growing epitaxial layers of AlGaInN-based material over the buffer layer to sequentially form the lower AlGaInN region, the active region, and the upper AlGaInN region of the multi-layered epitaxial structure. In one embodiment, the lower AlGaInN region is made exclusively of GaN epitaxial layers. In another embodiment, the lower AlGaInN region is made of AlGaInN epitaxial layers and other AlGaInN-based epitaxial layers. Preferably, the lower AlGaInN region of the multi-layered epitaxial structure has a thickness greater than 3 micrometers. As an example, the lower AlGaInN region may have a thickness of approximately 7 micrometers. Additional steps may then be executed to complete the AlGaInN-based LED, such as forming the ohmic contacts of the LED.

While the above process flow provides optional texturing of the AlGaInN multi-layered epitaxial structure at the substrate interface, it is also possible and preferable to texture the top surface of the AlGaInN multi-layered epitaxial structure to improve light extraction. This may be done either before or after the formation of the top surface ohmic contacts.

Although the AlGaInN-based LED 32 is described as a device that emits the top surface light through the semi-transparent metallic layer 54, the LED can also be an inverted device having a highly reflective metallization instead of the semi-transparent metallic layer. In this inverted LED, the top surface light is emitted through the transparent substrate.

Figure 8:
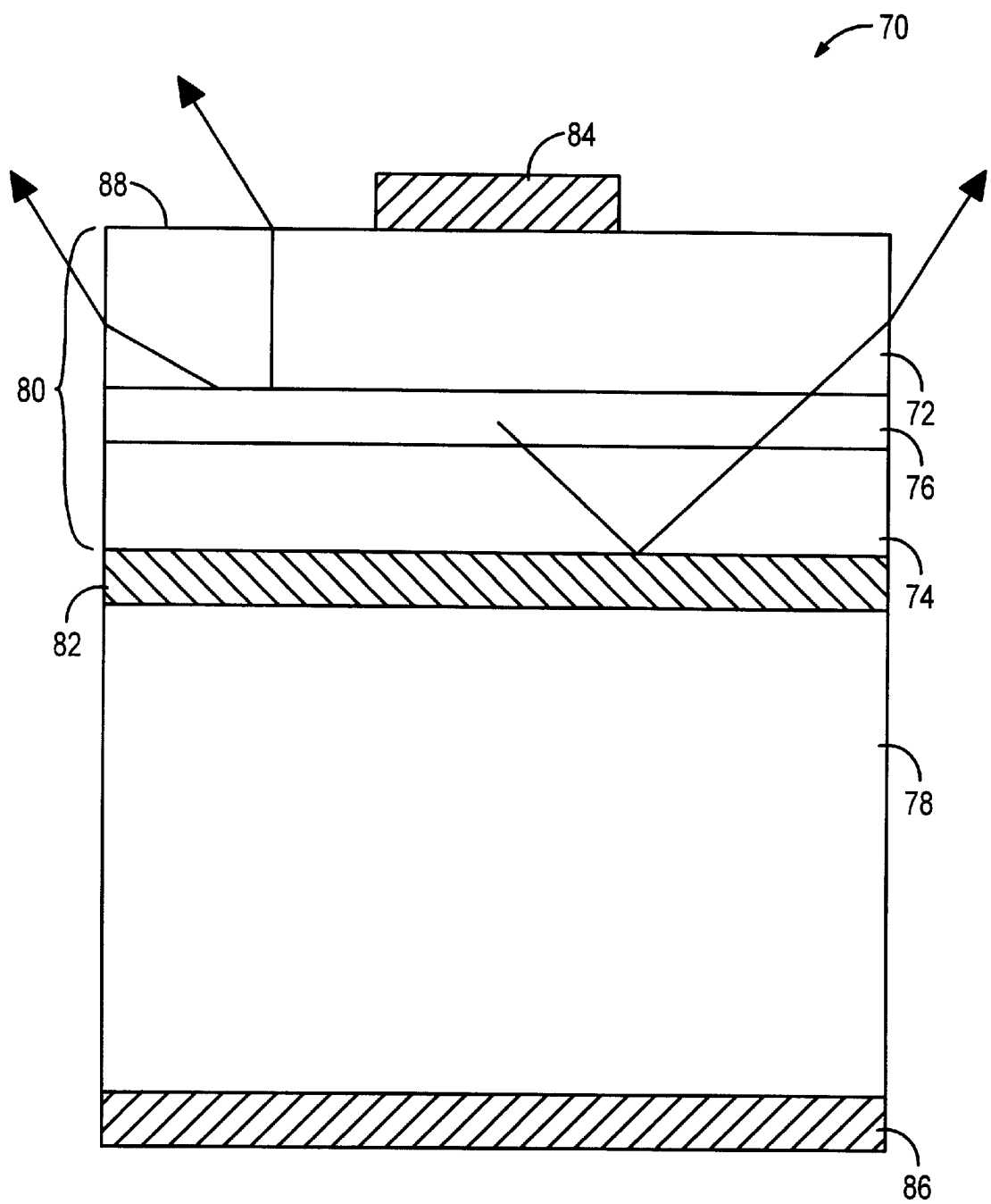
FIG. 8 is a schematic diagram of a vertical injection AlGaInN-based LED having a thick multi-layered epitaxial structure in accordance with the invention.

Another preferred embodiment of an AlGaInN-based LED employing a thick AlGaInN multi-layered epitaxial structure is a vertical injection structure, which is illustrated in FIG. 8. This LED structure 70 employs n-type and p-type AlGaInN layers 72 and 74 on either side of an active region 76, such that either the n-type or p-type layers is electrically connected to a conductive substrate 78. The conductive substrate may be composed of an opaque material, such as silicon (Si). This substrate may be provided by bonding the AlGaInN multi-layered epitaxial structure 80, including the original growth substrate (not shown), to the conductive substrate via metallic interfacial layers 82. The metallic interfacial layers provide electrical connection between the substrate and AlGaInN epitaxial layers via ohmic contacts 84 and 86, while providing adhesion between the substrate and the AlGaInN multi-layered epitaxial structure. After bonding, the original growth substrate is removed by any of a number of techniques known in the art, such as laser lift-off, or removal via selective etching with the inclusion of a sacrificial layer between the AlGaInN multi-layered epitaxial structure and the original growth substrate.

After the original growth substrate removal, the exposed surface 88 of the AlGaInN multi-layered epitaxial structure 80 may be textured, and the ohmic contact 84 is formed to complete the vertical injection device 70. As described previously in this teaching, increasing the thickness of the AlGaInN epitaxial layers provides increased extraction efficiency for this device by reducing losses associated with light trapped between the AlGaInN/epoxy interface and the AlGaInN/metallic-layer interface. The AlGaInN multi-layered epitaxial structure has an approximate thickness of 4 micrometers or greater. As an example, the thickness of the multi-layered epitaxial structure may be approximately 7 micrometers. However, the thickness of the multi-layered epitaxial structure may be approximately 15 micrometers or greater.

What is claimed is:

1. An AlGaInN light-emitting diode device comprising:
   a substrate; and
   a multi-layered epitaxial structure having an active region coupled to said substrate, said multi-layered epitaxial structure including a first region of epitaxial layers that is positioned above said active region and a second region of epitaxial layers that is positioned below said active region, said epitaxial layers of said first and second regions including a plurality of epitaxial layers that are composed of at least one element selected from a group consisting of aluminum, gallium, indium, and nitrogen, said multi-layered epitaxial structure having a thickness of at least four micrometers, said thickness of said multi-layered epitaxial structure effectuating an increased extraction of light emitted from said active region through sides of said multi-layered epitaxial structure.

2. The device of claim 1 wherein said multi-layered epitaxial structure is configured such that said multi-layered epitaxial structure has a thickness of at least seven micrometers.

3. The device of claim 1 wherein said multi-layered epitaxial structure is configured such that said multi-layered epitaxial structure has a thickness of approximately seven micrometers.

4. The device of claim 1 wherein said multi-layered epitaxial structure is configured such that said multi-layered epitaxial structure has a thickness of at least fifteen micrometers.

5. The device of claim 1 wherein said second region of said multi-layered epitaxial structure has a thickness greater than three micrometers.

6. The device of claim 1 wherein said second region of said multi-layered epitaxial structure has a thickness greater than seven micrometers.

7. The device of claim 1 wherein said second region of said epitaxial layers includes at least one undoped epitaxial layer, said undoped epitaxial layer being made of aluminum-gallium-indium-nitride-based material.

8. The device of claim 1 wherein said substrate is configured such that said surface of said substrate that is coupled to said multi-layered epitaxial structure is a textured surface, said textured surface of said substrate facilitating a randomization of light that impinges upon said textured surface.

9. An AlGaInN light-emitting diode device comprising:
   a substrate;
   a first region of undoped epitaxial layers positioned adjacent to said substrate, said undoped epitaxial layers being composed of at least one element selected from a group consisting of aluminum, gallium, indium, and nitrogen;
   an n-type region of n-type epitaxial layers coupled to said first region, said n-type epitaxial layers being composed of at least one element selected from a group consisting of aluminum, gallium, indium, and nitrogen;
   an optoelectronic active region coupled to said n-type region; and
   a p-type region of p-type epitaxial layers coupled to said active region, said p-type epitaxial layers being composed of at least one element selected from a group consisting of aluminum, gallium, indium, and nitrogen,
   wherein said first region, said n-type region, said active region, and said p-type region have a total thickness of at least four micrometers, said total thickness effectuating an increased extraction of light emitted from said active region through sides of said light-emitting diode device.

10. The device of claim 9 wherein said first region, said n-type region, said active region, and said p-type region are configured such that said total thickness is at least seven micrometers.

11. The device of claim 9 wherein said first region, said n-type region, said active region, and said p-type region are configured such that said total thickness is at least fifteen micrometers.

12. The device of claim 9 wherein said first region of said undoped epitaxial layers is configured such that said first region has a thickness greater than three micrometers.

13. The device of claim 9 wherein said first region of said undoped epitaxial layers is configured such that said first region has a thickness greater than seven micrometers.

14. The device of claim 9 wherein said substrate is configured such that said surface of said substrate that is coupled to said first region is a textured surface, said textured surface of said substrate facilitating a randomization of said emitted light that impinges upon said textured surface.

* * * * *